(12) United States Patent
Uehling et al.

(10) Patent No.: US 7,129,566 B2
(45) Date of Patent: Oct. 31, 2006

(54) SCRIBE STREET STRUCTURE FOR BACKEND INTERCONNECT SEMICONDUCTOR WAFER INTEGRATION

(75) Inventors: Trent S. Uehling, New Braunfels, TX (US); Kevin J. Hess, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/880,681

(22) Filed: Jun. 30, 2004

(65) Prior Publication Data

US 2006/0001144 A1      Jan. 5, 2006

(51) Int. Cl.
*H01L 23/544* (2006.01)

(52) U.S. Cl. ............ 257/620; 257/619; 257/690; 257/762; 438/460

(58) Field of Classification Search ........... 257/620, 257/619, 690, 762, E23.194; 438/460
See application file for complete search history.

(56) References Cited

U.S. PATENT DOCUMENTS

| | | | |
|---|---|---|---|
| 5,530,280 A * | 6/1996 | White ............... | 257/508 |
| 5,831,330 A | 11/1998 | Chang | |
| 5,834,829 A | 11/1998 | Dinkel et al. | |
| 6,365,958 B1 * | 4/2002 | Ibnabdeljalil et al. ....... | 257/620 |
| 6,521,975 B1 * | 2/2003 | West et al. ............ | 257/620 |
| 6,605,861 B1 * | 8/2003 | Toyoda ............... | 257/620 |
| 6,650,010 B1 | 11/2003 | Davis et al. | |
| 6,806,168 B1 * | 10/2004 | Towle et al. ............ | 438/460 |
| 6,876,064 B1 * | 4/2005 | Matumoto et al. ......... | 257/632 |
| 2002/0130394 A1 * | 9/2002 | Toyoda ............... | 257/618 |

* cited by examiner

*Primary Examiner*—Kenneth Parker
*Assistant Examiner*—Chris C. Chu
(74) *Attorney, Agent, or Firm*—Michael J. Balconi-Lamica; David G. Dolezal

(57) ABSTRACT

A method of making a semiconductor device includes forming a wafer having a substrate and an interconnect structure over the substrate. The wafer also includes a plurality of die areas and a street located between a first die area of the plurality and a second die area of the plurality. A separation structure that includes metal is located in the interconnect structure. At least a portion of the separation structure is located in a saw kerf of the street. The separation structure is arranged to provide a predefined separation path for separating the first die area during a singulation process.

10 Claims, 4 Drawing Sheets

SCRIBE STREET STRUCTURE FOR BACKEND INTERCONNECT SEMICONDUCTOR WAFER INTEGRATION

BACKGROUND

The present disclosure relates generally to semiconductors, and more particularly, to a scribe street structure for backend interconnect semiconductor wafer integration and method for forming the same.

In present metal and dielectric semiconductor wafer integration, during a sawing operation (singulation) of the semiconductor die of a wafer, uncontrollable cracking or chipping occurs within the dielectric layers of the backend interconnect structure of the semiconductor die or within the bulk substrate (Si, etc) of the semiconductor die. Such cracking can propagate into the active die area and cause immediate or latent electrical failure of the device.

One known technique of stopping cracks in a dielectric material includes placing one continuous barrier wall adjacent each chip and a sacrificial composite structure in combination therewith, between the wall and the center of a dicing line. The composite structure includes a means for dispersing the energy associated with crack propagation, whereby any crack having sufficient energy to penetrate the composite structure is transformed into a plurality of weaker cracks incapable of penetrating the barrier wall. However, such a technique has limits with respect to the magnitude of the cracks that it can arrest, and furthermore, does not facilitate a predictable separation path.

In addition, the problem of delamination and crack propagation has historically been solved by a number of methods. One approach included attempting to improve the adhesion strength of the materials being singulated. Another method included constructing a "crack stop" or barrier that impedes crack propagation. Yet another method included increasing the scribe width (i.e., buffer zone) to increase the distance a crack must propagate before it becomes lethal to the device. Still further, another method included reducing the singulation process throughput, either by reducing cut speed or changing saw blades at a more frequent interval. In general, these methods fail to provide for an optimized process.

Accordingly, it would be desirable to provide an improved semiconductor manufacturing method for overcoming the problems in the art.

SUMMARY

A method of making a semiconductor device includes forming a wafer having a substrate and an interconnect structure over the substrate. The wafer also includes a plurality of die areas and a scribe street located between a first die area of the plurality and a second die area of the plurality. A separation structure that includes metal is located in the interconnect structure. At least a portion of the separation structure is located in a saw kerf of the scribe street. The separation structure is arranged to provide a predefined separation path for separating the first die area during a singulation process.

BRIEF DESCRIPTION OF THE DRAWINGS

The embodiments of the present disclosure are illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
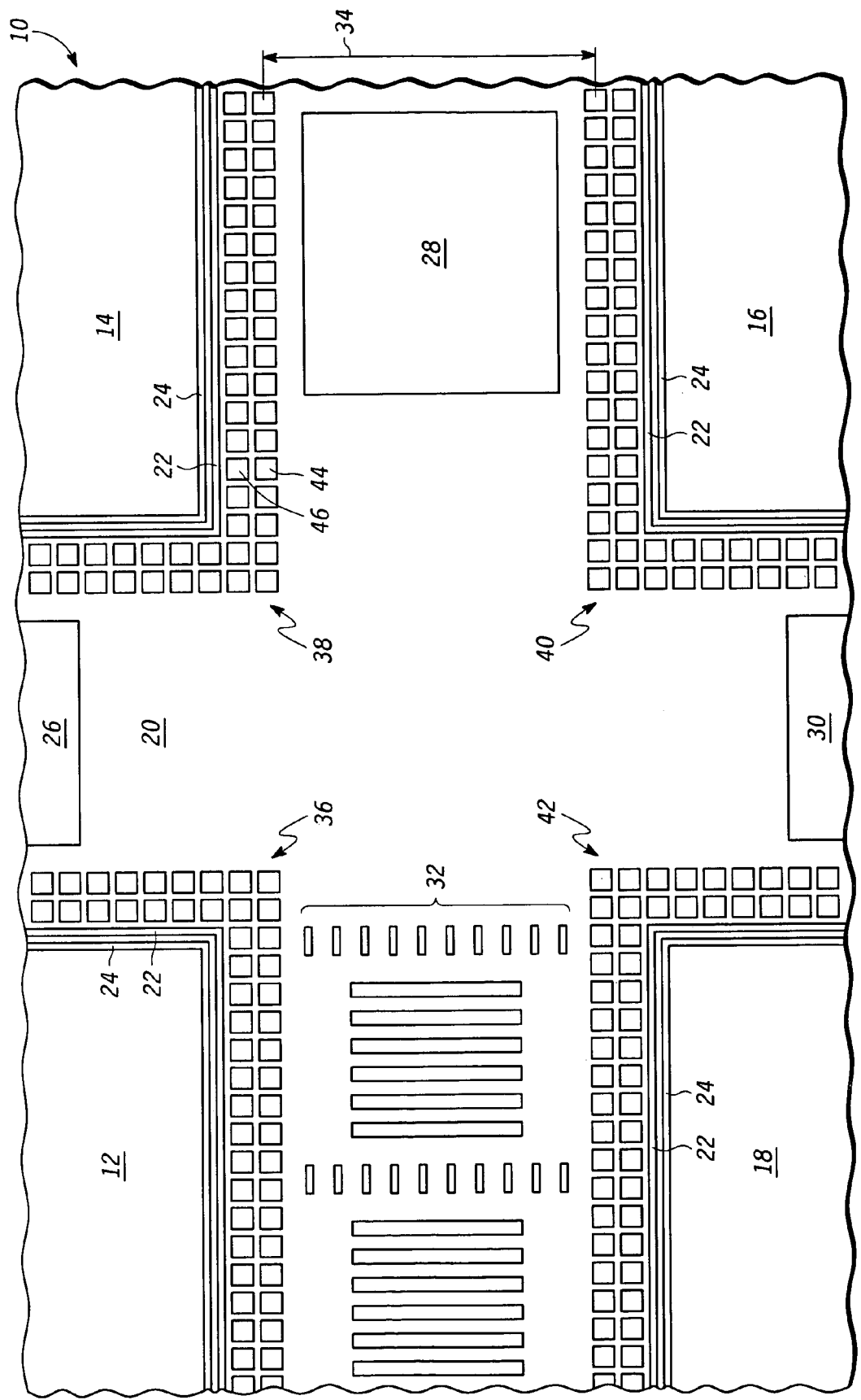
FIG. 1 is a top layout plan view of a scribe street having a separation structure according to one embodiment of the present disclosure.

FIG. 1 is a top layout plan view of a scribe street having a separation structure according to one embodiment of the present disclosure. Semiconductor wafer 10 includes a plurality of die areas as indicated by reference numerals 12, 14, 16, and 18. Die areas 12, 14, 16 and 18 represent active and/or functional regions of the wafer 10. Die areas 12, 14, 16 and 18 are separated from one another by scribe street 20. In one embodiment, scribe street 20 has a width dimension on the order of approximately 80–120 µm. In addition, each die area includes a crack stop 22 and edge seal 24. Crack stop 22 is provided for terminating cracks that may propagate in a direction of a corresponding die. Edge seal 24 provides a seal for protecting a corresponding die during singulation and/or packaging steps.

Wafer 10 can also include one or more test pads (26, 28 and 30) and other structures, for example photo alignment key 32, located within the scribe street 20. Test pads (26, 28 and 30) provide an interface for electrical tests of various test structures for process monitoring. The photo alignment key 32 provides an alignment target or reference for mask alignments and/or related processing steps.

During a singulation process, the various die regions of wafer 10 are separated by cutting within the scribe street 20. The material removed during cutting is contained within a region described as the saw blade kerf region. As shown in FIG. 1, the saw blade kerf can be of a given width, such as illustrated by the arrow indicated by reference numeral 34.

FIG. 1 further illustrates scribe street 20 having a plurality of separation structures according to one embodiment of the present disclosure. Separation structures are indicated, for example, by reference numerals 36, 38, 40 and 42. In particular, separation structure 36 surrounds die area 12. Separation structure 38 surrounds die area 14. Separation structure 40 surrounds die area 16. Similarly, separation structure 42 surrounds die area 18. Wafer 10 can further include additional die areas and additional separation structures (not shown) surrounding respective ones of the additional die areas.

With respect to the separation structures, the separation structures include at least two rows of column portions to be discussed further herein below. Each row of the column portions is separated from another row of column portions by a potential separation path. In FIG. 1, two column portions of separation structure 38 are indicated by reference numerals 44 and 46.

Figure 2:
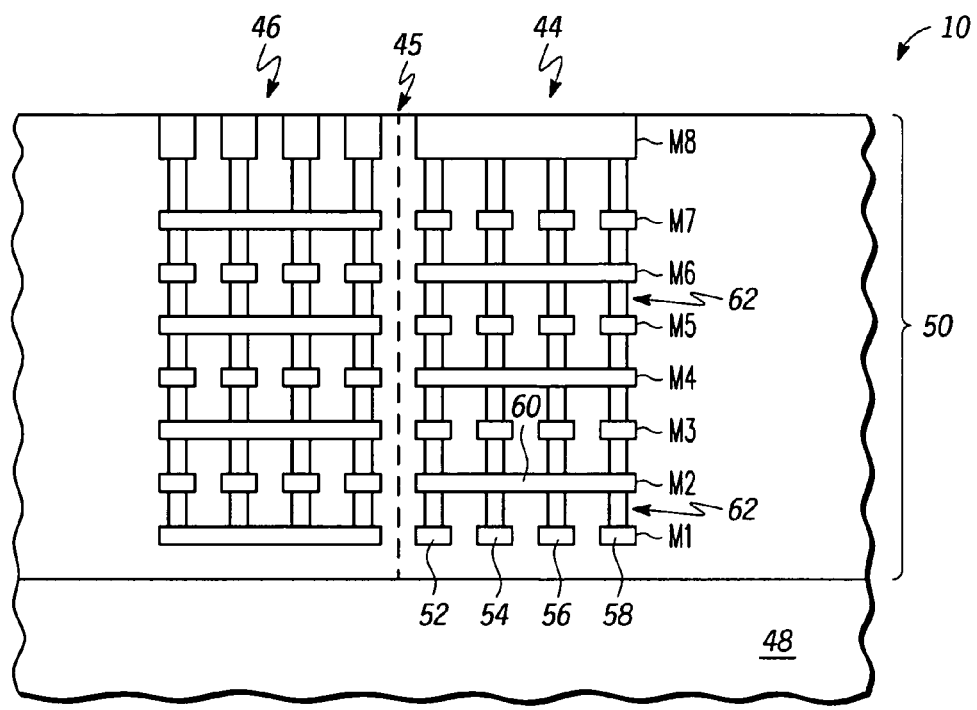
FIG. 2 is a side view of two adjacent columns of the separation structure of the scribe street according to one embodiment of the present disclosure.

FIG. 2 is a side view of two adjacent column portions (44,46) of the separation structure 38 of the scribe street 20 according to one embodiment of the present disclosure. Prior to discussing the column portions further, note that semiconductor wafer 10 includes a substrate 48 and an interconnect structure 50 overlying the substrate 48. The interconnect structure 50 includes a plurality of metal interconnect layers, vias, dielectric layers, other layers (e.g., barrier layers), etc., according to the particular requirements of a semiconductor device manufacturing process.

Referring again to the column portions 44 and 46, a separation path 45 is disposed in between the column portions. Column portions 44 and 46 form selectively reinforced structures, separated by a non-reinforced region. Separation path 45 lies within the non-reinforced region. In addition, column portions 44 and 46 can be made similarly or different. For example, column portion 46 may include one or more independent columns coupled together at one or more metal layers, thus creating a portion having a length different than column portion 44.

In one embodiment, column portion 44 comprises a plurality of interconnect layers. Interconnect layers include, for example, metal and via layers. As shown, metal layers of column portion 44 include metal 1 (M1) through metal 8 (M8) (or last metal) for the particular semiconductor device application. Metal 1 layer includes a plurality of metal lines 52, 54, 56, and 58, extending perpendicular to the surface of and into the drawing figure. Metal 2 layer includes a plurality of metal lines, in a plane above the plane of metal 1, and oriented perpendicular to the metal lines of metal 1. For example, metal 2 includes metal line 60, extending left to right. Interconnecting adjacent metal layers of column portion 44 are vias 62. As shown, a first metal layer includes metal lines oriented in a first direction and a second metal layer overlying the first metal layer and having metal lines oriented in a second direction, the second direction being perpendicular to the first direction. The metal lines of the first metal layer couple to the metal lines of the second metal layer using vias.

In addition, the use of metal lines (versus solid metal regions) in column portion 44 is determined in part by the design rules of the particular semiconductor device manufacturing process being used to construct semiconductor devices with the various embodiments of the separation structure of the present disclosure. Alternatively, if design rules of a given semiconductor device manufacturing process permit, the first metal layer could include a solid metal area having a metal density up to one hundred percent (100%) and the second metal layer could include a similar solid metal area, the first metal layer being coupled to the second metal layer using vias. Alternatively, the second metal layer could include an area different from a solid metal area. As used herein, metal density includes a percentage of metal by area in a given layer.

Figure 3:
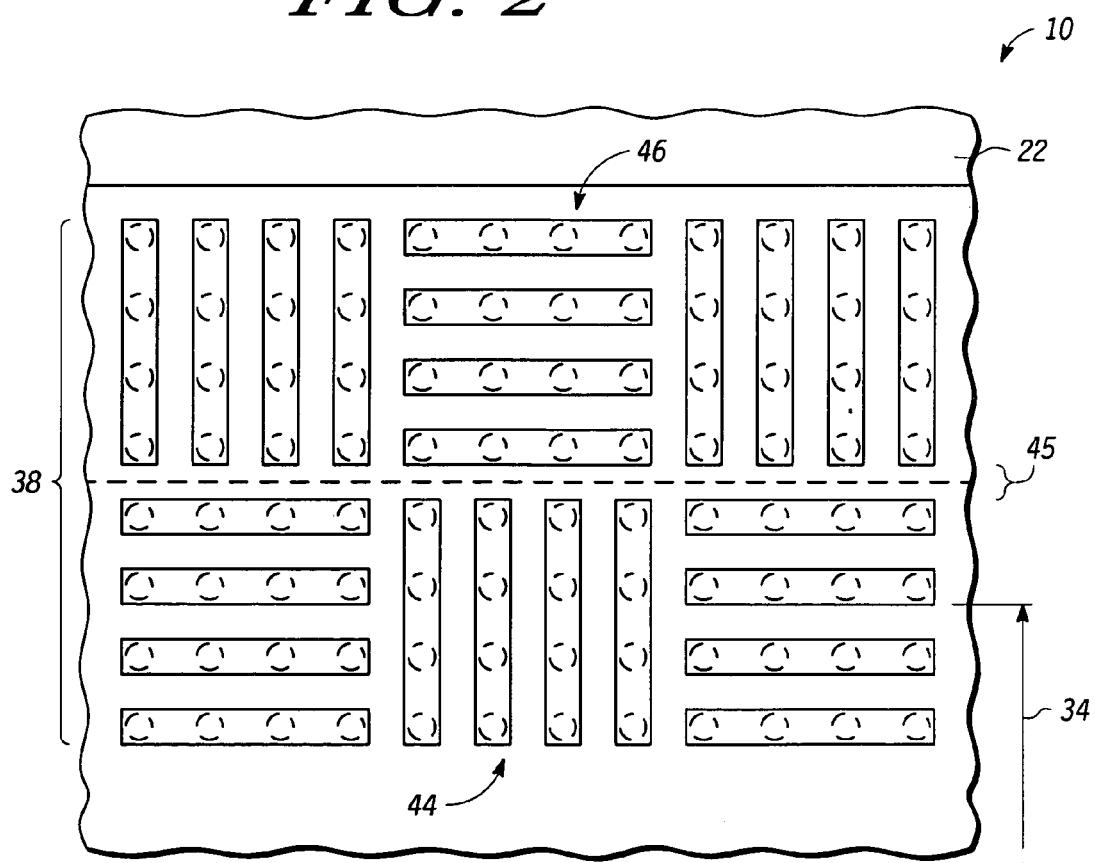
FIG. 3 is a top layout plan view of a portion of the scribe street in greater detail according to one embodiment of the present disclosure.

FIG. 3 is a top layout plan view of a portion of the scribe street 20 in greater detail according to one embodiment of the present disclosure. In particular, separation structure 38 comprises two adjacent rows of column portions of selectively reinforced structures separated by a non-reinforced region. Separation path lies within the non-reinforced region. As shown, the column portions of a first row are aligned with column portions of the second row, for example, column portion 44 is in alignment with column portion 46. In addition, the metal lines of a top most layer of column portion 44 are oriented perpendicularly with respect to metal lines of a top most layer of column portion 46. Within a single row of column portions, metal lines of a top most layer of adjacent column portions of the selectively reinforced structures are oriented perpendicular to one another. Still further, note that a portion of saw blade kerf 34 falls within the row of column portions including column portion 44. Upon an interaction of a saw blade with the row of column portions (i.e., the one containing column portion 44) of separation structure 38, a separation preferentially propagates along the separation path 45.

Figure 4:
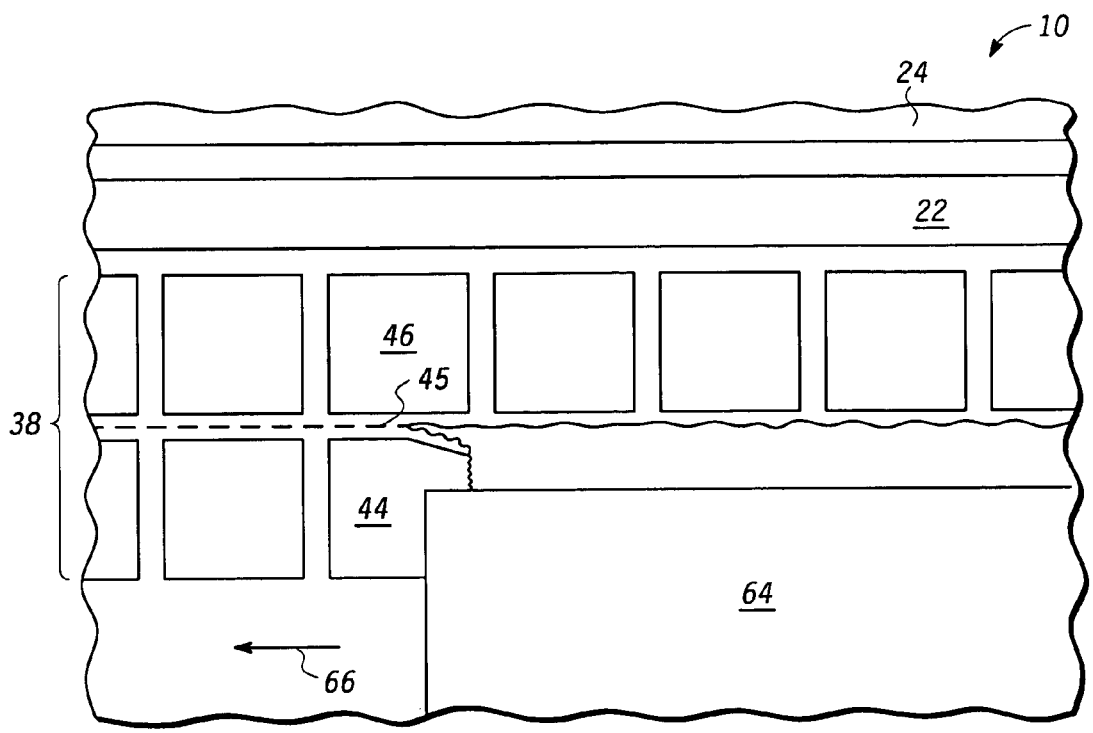
FIG. 4 is a top layout plan view of a portion of the scribe street according to one embodiment of the present disclosure that illustrates a separation process.

FIG. 4 is a top layout plan view of a portion of the scribe street 20 according to one embodiment of the present disclosure that illustrates a separation process along the separation path 45. During the singulation operation, a saw blade 64 is advanced across the wafer 10 within the scribe street 20 in a direction indicated by the arrow 66. As the saw blade 64 cuts into the row of column portions of the separation structure 38, and in particular, the one containing column portion 44, separation preferentially propagates along the separation path 45. Such a preferential propagation of the separation results from an interaction of the saw with the row of column portions and the presence of a non-reinforced region between adjacent rows of the column portions of the separation structure 38.

Figure 5:
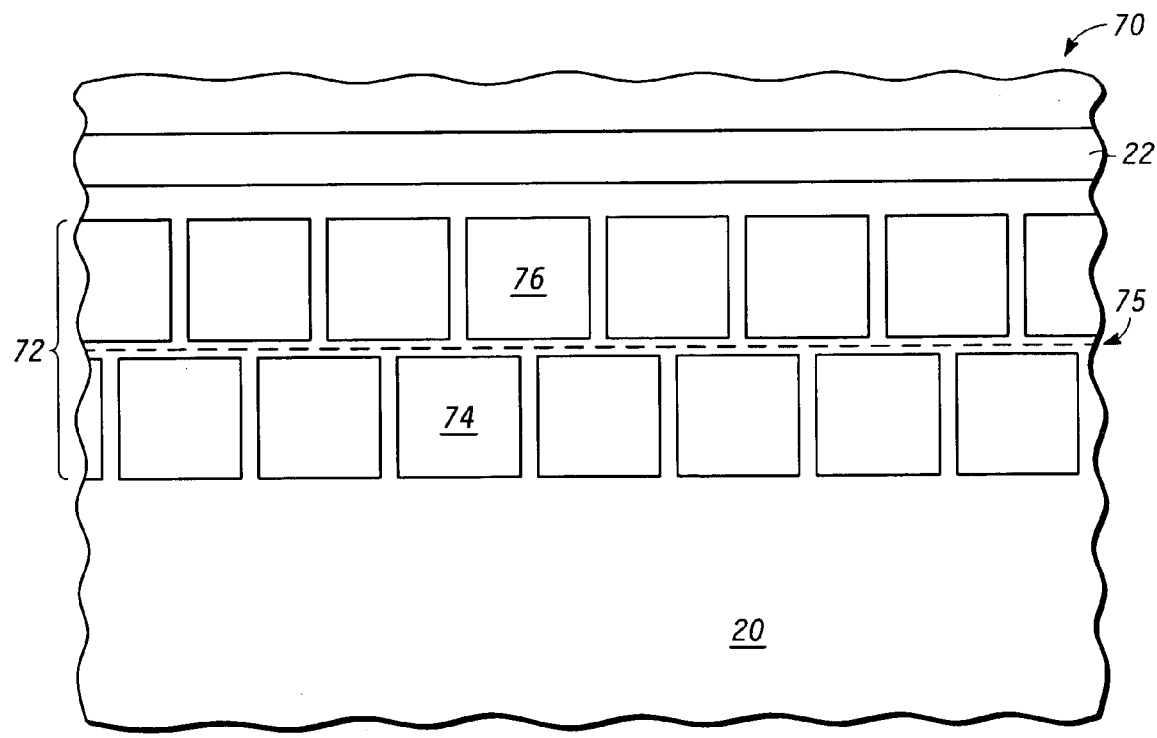
FIG. 5 is a top layout plan view of a scribe street having a separation structure according to another embodiment of the present disclosure.

FIG. 5 is a top layout plan view 70 of a scribe Street 20 having a separation structure 72 according to another embodiment of the present disclosure. Separation structure 72 is similar to the separation structure 38 discussed herein above, with the following differences. Separation structure 72 includes a first row of column portions and a second row of column portions, wherein the column portions of the first row are in a staggered arrangement with respect to the column portions of the second row. For example, column portion 74 is in a staggered alignment with respect to column portion 76. In other words, the column portions of the first row are offset from a corresponding column portion of the second row by an amount less than the width of an individual column portion. In addition, separation path 75 occurs within a region between the first and second rows of column portions.

Figure 6:
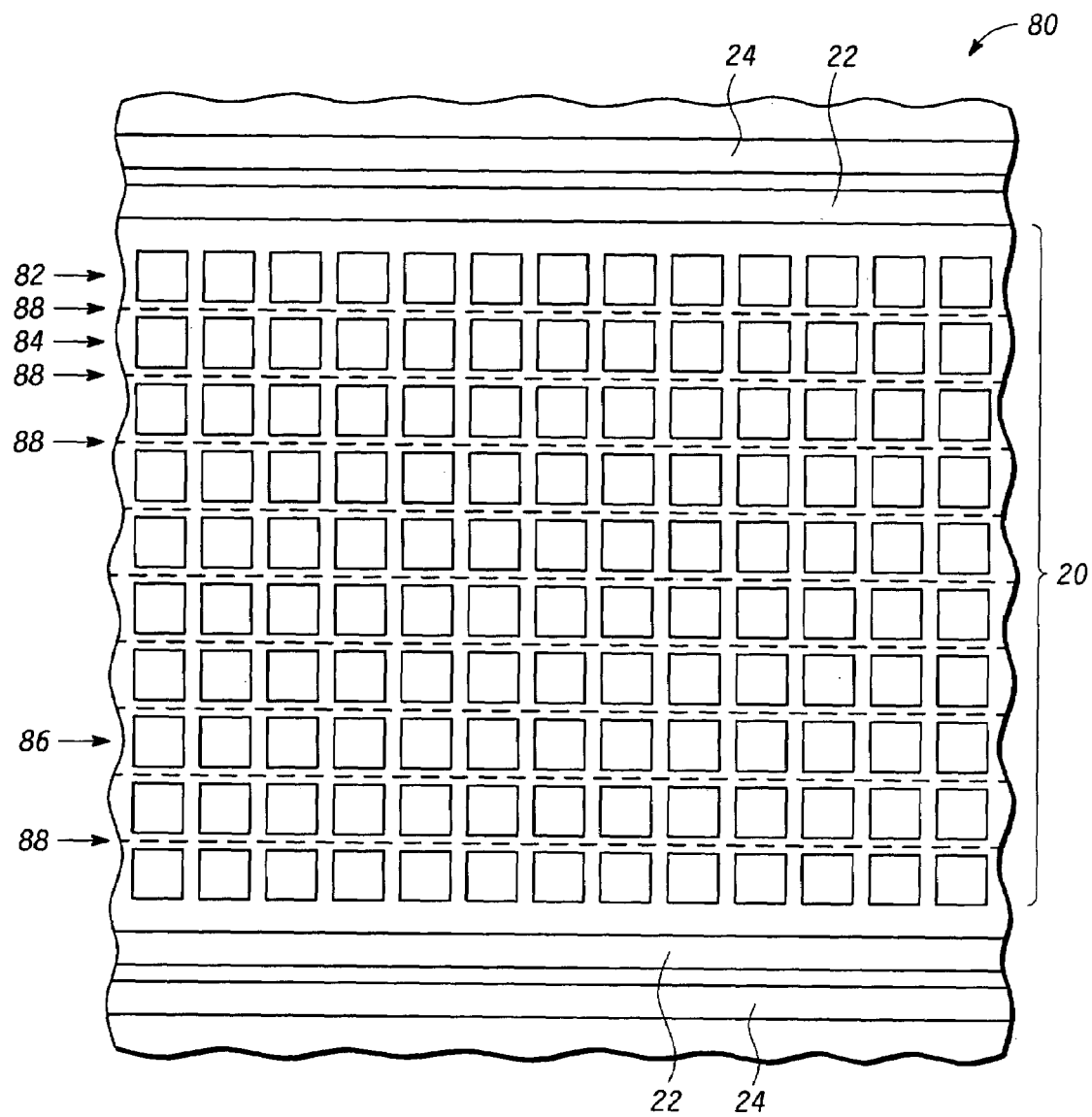
FIG. 6 is a top layout plan view of a scribe street having a separation structure according to yet another embodiment of the present disclosure.

FIG. 6 is a top layout plan view 80 of a scribe street 20 having a separation structure according to yet another embodiment of the present disclosure. The separation structure is similar to the separation structure 38 discussed herein above, with the following differences. The separation structure of FIG. 6 includes a plurality of rows of column portions spanning across the scribe street 20. For example, several of the rows of column portions are indicated by reference numerals 82, 84, and 86. Potential separation paths between adjacent rows of column portions of the separation structure are indicated by reference numeral 88. Furthermore, as shown, the column portions of a first row are in an aligned arrangement with respect to the column portions of a second row. Alternatively, the column portions of a first row can be arranged in a staggered alignment with respect to column portions of a second row.

The embodiments of the present disclosure advantageously provide specially designed separation structures to substantially eliminate uncontrollable cracking or chipping within the dielectric layers or bulk substrate (Si, etc) of the semiconductor die during a singulation operation. Accordingly, during singulation, the likelihood that cracking can propagate into the active die area and cause immediate or latent electrical failure of the device is substantially reduced, if not eliminated. The present embodiments further allow for a reduction in scribe street width for wafers incorporating low-k dielectrics in the back end interconnect structure. As used herein, low-k refers to dielectrics having a value under 3.50.

As discussed herein, the structures in the embodiments of the present disclosure comprise discontinuous metal lines separated by spaces of dielectric to facilitate preferential removal. That is, the metal features are preferentially delaminated and removed as part of the saw kerf, as opposed to functioning as a crack stop or energy dissipating structure. In one embodiment, the discontinuous metal lines, separated by dielectric, alternate in their respective orientations relative to a die edge. Furthermore, the structures of the present embodiments are not intended to remain intact, but rather are intended to be preferentially removed in the wafer sawing process. Accordingly, the separation structure breaks up into manageable pieces of the discontinuous metal lines.

In one embodiment of the present disclosure, specially designed scribe street structures are utilized to control delamination of Copper low-k (low dielectric constant) films or layers. These specially designed scribe street structures will either prevent or terminate propagation of inter-layer cracks initiated by the sawing (or singulation) process. The separation structure further incorporates weak sub-structures or components that preferentially fail during the singulation process. In one embodiment, the structures comprise stacks of short metal lines layered orthogonally and separated by a vertical dielectric interface. The vertical dielectric interface takes advantage of the weak mechanical strength in order to preferentially guide failure along the edges of the saw kerf, thereby providing for a predictable damage during the sawing operation.

The embodiments of the present disclosure differ from prior methods in that the embodiments intentionally introduce a weak structure that fails preferentially over adjacent structures. This structure is removed during the singulation process and produces a predictable, controlled failure mechanism, thereby eliminating the need for "buffer zones." In other words, the separation structure comprises a weak zone within two reinforced zones.

In one embodiment, the method and separation structure can be used in any copper (Cu) low-k wafer integration. The method and separation structure could also be extended to any semiconductor wafer technology.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor wafer comprising:
    a substrate;
    an interconnect structure located over the substrate;
    a plurality of die areas;
    a street located between a first die area of the plurality and a second die area of the plurality; and
    a separation structure, wherein the separation structure includes at least two rows of a plurality of independent column portions of metal structures located in the interconnect structure, at least a portion of the separation structure is located in a saw kerf of the street, wherein each row of the plurality of independent column portions of metal structures of the separation structure is spaced apart from another row of the plurality of independent column portions of metal structures to provide a potential separation path in between adjacent rows of independent column portions of metal structures for separating the first die area during a singulation process,
    further wherein each independent column portion of metal structures of a row comprises a selectively reinforced structure, separated from an adjacent selectively reinforced structure of the same row by a non-reinforced region,
    further wherein a first row of the plurality of independent column portions of metal structures is separated from an adjacent row of the plurality of independent column portions of metal structures by a non-reinforced region,
    further wherein the potential separation path lies within the non-reinforced region between the adjacent rows of the plurality of independent column portions of metal structures, and
    further wherein the at least two rows of the plurality of independent column portions of metal structures are configured to produce a predictable, controlled failure mechanism by breaking up into manageable pieces of column portions during the singulation process.

2. The semiconductor wafer of claim 1, wherein each independent column portion of the metal structures includes a first plurality of metal lines located in a first interconnect layer of the interconnect structure, wherein the first plurality of metal lines are oriented generally parallel to each other, each independent column portion of the metal structures further includes a second plurality of metal lines located in a second interconnect layer of the interconnect structure, wherein the second plurality of metal lines are oriented generally parallel to each other and further oriented generally orthogonal to the first plurality of metal lines of the first interconnect layer, further wherein the second plurality of metal lines are physically coupled by metal vias to the first plurality of metal lines.

3. The semiconductor wafer of claim 2, wherein each independent column portion of metal structures further comprises:
    a third plurality of metal lines located in a third interconnect layer of the interconnect structure, wherein the third plurality of metal lines are oriented generally parallel to each other and generally parallel to the metal lines of the first plurality of metal lines;
    a fourth plurality of metal lines located in a fourth interconnect layer of the interconnect structure, wherein the fourth plurality of metal lines are oriented generally parallel to each other and generally parallel to the metal lines of the second plurality of metal lines.

4. The semiconductor wafer of claim 3, wherein the first interconnect layer is located above the second interconnect layer, the second interconnect layer is located above the third interconnect layer, and the third interconnect layer is located above the fourth interconnect layer.

5. The semiconductor wafer of claim 3, further wherein the third plurality of metal lines are physically coupled by metal vias to the second plurality of metal lines, and the fourth plurality of metal lines are physically coupled by metal vias to the third plurality of metal lines.

6. The semiconductor wafer of claim 1, further comprising dielectric material located in between adjacent rows of independent column portions of metal structures along the separation path in the interconnect structure.

7. The semiconductor wafer of claim 6, wherein the dielectric material comprises a low-k dielectric material, the low-k dielectric material having a dielectric value under 3.50.

8. The semiconductor wafer of claim 1, further comprising:

a first crack stop located in the first die area;

a second crack stop located in the second die area, wherein the separation structure is located between the first crack stop and the second crack stop.

9. The semiconductor wafer of claim 8, further comprising:

a first edge seal located on a die side of the first crack stop;

a second edge seal located on a die side of the second crack stop.

10. The semiconductor wafer of claim 1, wherein the metal includes copper.

* * * * *